(12) United States Patent
Fenker

(10) Patent No.: US 10,701,812 B2
(45) Date of Patent: Jun. 30, 2020

(54) METHOD FOR MANUFACTURING A SWITCHGEAR CABINET

(71) Applicant: Liebherr-Components Biberach GmbH, Biberach an der Riss (DE)

(72) Inventor: Oliver Fenker, Warthausen (DE)

(73) Assignee: Liebherr-Components Biberach GmbH, Biberach an der Riss (DE)

( * ) Notice: Subject to any disclaimer, the term of this patent is extended or adjusted under 35 U.S.C. 154(b) by 0 days.

(21) Appl. No.: 16/011,346

(22) Filed: Jun. 18, 2018

(65) Prior Publication Data

US 2018/0317328 A1    Nov. 1, 2018

Related U.S. Application Data

(63) Continuation of application No. PCT/EP2016/002022, filed on Nov. 30, 2016.

(30) Foreign Application Priority Data

Dec. 18, 2015 (DE) .......... 10 2015 016 505
Feb. 22, 2016 (DE) .......... 10 2016 002 052

(51) Int. Cl.
*H05K 3/46* (2006.01)
*H05K 7/18* (2006.01)
(Continued)

(52) U.S. Cl.
CPC ............ *H05K 3/4664* (2013.01); *B33Y 10/00* (2014.12); *B33Y 80/00* (2014.12); *H05K 1/16* (2013.01);
(Continued)

(58) Field of Classification Search
CPC ........ B23K 26/34; B23K 26/342; H05K 1/16; H05K 3/10; H05K 3/125; H05K 3/1275; H05K 3/1283; H05K 3/4664; H05K 7/18; H05K 2201/10053; B33Y 10/00; B33Y 80/00; H02B 1/04; H02B 1/301; H02B 3/00
See application file for complete search history.

(56) References Cited

U.S. PATENT DOCUMENTS 6,146,716 A * 11/2000 Narang ................. G02B 26/02
                                                       427/261
6,713,389 B2 * 3/2004 Speakman ................. B41J 2/01
                                                       438/674
(Continued)

FOREIGN PATENT DOCUMENTS

DE        8902022 U1     6/1989
DE      102011100555     7/2012
(Continued)

*Primary Examiner* — Carl J Arbes
(74) *Attorney, Agent, or Firm* — Levine Bagade Han LLP

(57) ABSTRACT

The present invention relates, in general, to switchgear cabinets comprising at least one switchboard having at least one base plate on which electrical switching elements are arranged and electrically interconnected. In this regard, the invention relates, in particular, to a method for manufacturing a switchgear cabinet of the said type. It is proposed to manufacture the switchgear cabinet or the electrical components thereof using three-dimensional printing technology to the greatest possible extent.

13 Claims, 2 Drawing Sheets

(51) Int. Cl.
*B33Y 10/00* (2015.01)
*B33Y 80/00* (2015.01)
*H05K 1/16* (2006.01)
*B23K 26/342* (2014.01)
*H02B 1/04* (2006.01)
*H02B 1/30* (2006.01)
*H02B 3/00* (2006.01)

(52) U.S. Cl.
CPC .............. *H05K 7/18* (2013.01); *B23K 26/342* (2015.10); *H02B 1/04* (2013.01); *H02B 1/301* (2013.01); *H02B 3/00* (2013.01); *H05K 2201/10053* (2013.01)

(56) References Cited

U.S. PATENT DOCUMENTS

| | | | |
|---|---|---|---|
| 7,323,634 B2 * | 1/2008 | Speakman | H01G 9/2031 136/256 |
| 8,261,660 B2 * | 9/2012 | Menard | H01L 24/74 101/109 |
| 8,334,464 B2 * | 12/2012 | Edwards | H05K 3/12 174/260 |
| 2004/0231594 A1 * | 11/2004 | Edwards | B25B 11/005 118/719 |
| 2011/0207328 A1 * | 8/2011 | Speakman | H01L 51/0011 438/694 |
| 2013/0170171 A1 | 7/2013 | Wicker et al. | |
| 2015/0201499 A1 * | 7/2015 | Shinar | H05K 3/125 425/132 |
| 2015/0235798 A1 | 8/2015 | Takamura et al. | |
| 2015/0305198 A1 | 10/2015 | Brandt et al. | |

FOREIGN PATENT DOCUMENTS

| | | |
|---|---|---|
| DE | 102014201121 | 7/2015 |
| DE | 102014209762 | 11/2015 |
| EP | 2943048 | 11/2015 |
| WO | WO 2014/179345 A1 * | 11/2014 |
| WO | WO 2014/209994 | 12/2014 |
| WO | WO 2017/102065 | 6/2017 |

* cited by examiner

METHOD FOR MANUFACTURING A SWITCHGEAR CABINET

CROSS-REFERENCE TO RELATED APPLICATIONS

This application is a continuation of International Application No. PCT/EP2016/002022, filed Nov. 30, 2016, which claims priority to German Patent Application Nos. 10 2015 016 505.4, filed Dec. 18, 2015, and 10 2016 002 052.0, filed Feb. 22, 2016, all of which are incorporated by reference herein in their entireties.

BACKGROUND

The present invention relates, in general, to switchgear cabinets, which comprise at least one switchboard having at least one base plate, on which electrical switching devices are arranged and electrically interconnected for transmitting and/or distributing electrical energy to at least one piece of equipment. In this regard, the invention particularly relates to a method for manufacturing such a switchgear cabinet.

In the previous method of constructing switchgear cabinets, many manual procedures are included, for example drilling the circuit board, affixing the electrical components, and connecting the individual electrical connectors of the components. These manual procedures are subject to error and have high costs. Furthermore, in broad areas, it is usual to manufacture and assemble a switchgear cabinet in an operation specialized for this purpose, and then to transport it to the place of use, pre-assembled to a great extent, where then, only the external assemblies or equipment, such as, for example, the motors to be controlled by the switchgear cabinet, are connected, as is the case, for example, for cranes such as construction cranes, harbor cranes or offshore cranes. This regularly causes high transport costs.

In this regard, such switchgear cabinets regularly comprise multiple switchboards, which are accommodated in a switchgear cabinet housing horizontally and/or upright. In this regard, a plurality of switching elements are regularly mounted on base plates, which elements are electrically connected or wired with one another in order to implement the circuit logic. In this regard, the said switching elements or devices can be of the most varied types, for example switches, buttons, display elements such as displays or indicator lights, measuring devices, input means such as touch screens, pushbuttons, toggle switches and the like. In particular, components of power electronics can also be provided as switching elements on the base plate, for example frequency inverters and the like. Fuses or test switches can also be part of the switchboard.

Such a switchgear cabinet therefore usually forms or comprises a low-voltage switching device combination in a corresponding empty housing, wherein the said switching device combination, in most cases, comprises both a control part in the form of an auxiliary circuit and a power part in the form of a main circuit, including the required monitoring such as fuses, for example. Therefore a switchgear cabinet contains both a combination of one or more low-voltage switching devices with related equipment for control, measurement, reporting, protection and regulation, with all internal electrical and mechanical connections and design parts.

In this regard, switchgear cabinets have the task of receiving electrical energy, during operation, from one or more suppliers, and of distributing this energy to other equipment by way of one or more cables or lines. In this regard, the aforementioned main circuit comprises all the conductive parts of a switching device combination in a circuit that is supposed to transmit electrical power, while the auxiliary circuit comprises all the conductive parts of a switching device combination in a circuit that is not the aforementioned main circuit and is not supposed to transmit any electrical power, for control, measurement, reporting, regulation, and data processing.

From the documents DE 89 02 022 U1, US 2015/0201499 A1, WO 2014/2009994 A2, and DE 10 2011 100 555 A1 it is known to manufacture electronic modules in the form of circuit boards by means of 3D printing and other coating measures, at least in part. In contrast to a switchgear cabinet, however, such circuit boards are merely electronic modules that serve for data processing and control, without electrical power being received by them and transmitted or distributed to corresponding consumers. Such electronic modules in the form of circuit boards were initially manufactured using analog technology, and this was then developed further, step by step, to digital technology and then microcontroller technology.

In contrast to switchgear cabinets, very much smaller voltage and power ranges occur in the case of such circuit boards and electronic modules. While in the case of circuit boards and similar electronic modules for data processing and control, topics such as contact safety, electric shock or electric arc accidents are almost irrelevant because of the small voltage and power ranges that prevail in the case of electronic modules, the same topics must almost always be considered in switchgear cabinet construction. Because of this fundamental difference between circuit boards and electronic modules for data processing and control, on the one hand, and switchgear cabinets for distributing and transmitting electrical energy to other operating elements, some of them with life-threatening voltages, the risk of shock, and electric arc accidents, on the other hand, special caution and safety measures are required for manufacturing switchgear cabinets, in order to counter the special hazards of a switchgear cabinet. In particular, individual low-voltage switching devices are installed and inserted separately, one after the other. Furthermore, special structuring of the internal structure, with separate installation plates and support rails, and a division into a main circuit and an auxiliary circuit were undertaken in order to take the aforementioned special hazards into account. However, this makes manufacturing complicated, with many parts, and causes fatigue for the switchgear cabinet assembler.

SUMMARY

The present invention is based on the task of indicating an improved switchgear cabinet of the aforementioned type, and an improved method for manufacturing same, which avoid the disadvantages of the state of the art and further develop this art in advantageous manner. In particular, the effort and the error susceptibility in connection with manufacturing and assembling the switchgear cabinet are supposed to be prevented, and decentralized manufacturing of the switchgear cabinet is supposed to be made possible.

According to the invention, this task is accomplished by means of a method according to the independent claims. Preferred embodiments of the invention are the object of the dependent claims.

It is therefore proposed to manufacture the switchgear cabinet, including its main circuit with its electrical components for transmitting and/or distributing electrical energy, using three-dimensional printing technology to the greatest possible extent. According to the invention, at least the base plate with at least one of the switching elements arranged on the base plate, for transmitting and/or distributing electrical energy, is manufactured by means of a 3D printer, using a 3D printing method. In this regard, the base plate and the said switching element can be built up in layers, wherein material layers can be liquefied and/or solidified one after the other, layer by layer, using an energy beam. For example, one or more materials can be applied in the form of a powder and/or paste and/or liquid, layer by layer, and can be melted or solidified accordingly, layer by layer, by means of a laser beam or electron beam or plasma beam and/or hardened and/or brought to chemical reaction, in order to form a hardened layer, in each instance. Surprisingly, it is also possible to manufacture power-transmitting switching devices, by means of which electrical power is received from one or more suppliers and distributed to consumers, by means of 3D printing technology, in sufficiently safe manner, so as to counter the special hazards in the case of switchgear cabinets, such as electric shocks, overheating, explosions or electric arcs. In contrast to previous expectations, even the switching device combination with a current that is supposed to transmit electrical power can be manufactured by means of a 3D printing method, with the required quality.

By means of such manufacturing using the 3D printing method, it is possible to manufacture the printed switchgear cabinets or parts of them directly at or close to the place of use, thereby making it possible to drastically reduce transport costs, since it is no longer necessary to transport the entire switchgear cabinet or its base plates and/or switching elements, but rather only to transport the manufacturing data required for the 3D printer. Furthermore, various manual assembly and manufacturing steps can be eliminated, particularly in connection with wiring, and thereby the related error susceptibility can be prevented. Furthermore, clearly greater design freedom exists in the conception and architecture of the switchboard.

In particular, in a further development of the invention, a switching logic can be integrated into the base plate. As a result, laborious wiring of the electrical switching elements affixed to the base plate can be avoided or at least greatly reduced, and thereby the error susceptibility connected with this can also be eliminated. In particular, electrical connection conductors for connecting the electrical switching elements and devices can be integrated into the base plate, wherein the said switching logic or the said electrical connection conductors can be formed by means of the 3D printer at the same time the base plate is formed, so that the circuit logic and the corpus of the base plate can be manufactured in one work step. Furthermore, smaller logic components such as resistors, inductors or capacitors, but also electrical or mechanical connectors and structural parts such as holders, guides or positioners can be integrated into the base plate and built up by means of 3D printing.

Alternatively or in addition to integral configuration of the connection conductors during the 3D printing process, channels and/or adaptations could also be formed as cavities during 3D printing of the base plate, into which cables, conductors or other electrical components can then subsequently be inserted.

Fundamentally, in this regard, only the base plate and the circuit logic integrated into it could be formed by means of the 3D printer, so that instead of the cable channels usual until now, hard-wired base plates are created, which can be manufactured in automated manner and can have internal conductor tracks for signal transmission. Commercially available switching devices could be used with such base plates, wherein the connections of the switching devices can be produced using lines to the said base plates. Alternatively, however, the switching devices or switching elements and, in particular, even power-transmitting components can also be manufactured by means of 3D printing, at least in part, as will still be explained.

As a further development of the invention, the base plate can be configured as a composite material plate composed of different materials, using the 3D printing method, wherein here, in particular, a signal-conducting and/or current-conducting material in the form of targeted structures can be embedded into a non-conductive matrix material. For example, copper structures, which then function as conductors in the finished base plate, can be embedded into a non-conductive matrix material, for example a ceramic material, wherein the plate corpus that forms with the copper structure is built up layer by layer. For this purpose, a matrix material can be distributed in powder form in every layer, for example, with copper particles or a copper powder being introduced at the desired locations, so that then, during energy beam treatment, a layer is formed in which a copper structure part is formed with local delimitations, which part then connects with the copper structure parts in the layer that lies underneath and in the layer that lies above and still has to be formed, to produce a conductor-shaped or strand-shaped conductive structure, for example.

The switchgear cabinet can fundamentally have multiple base plates connected with one another, each having at least one switching device combination, wherein the said base plates, including their switching device combinations, can be installed in the switchgear cabinet horizontally or upright. Instead of multiple base plates, one large base plate can also be used, on which all the switching elements are then arranged.

If multiple base plates are used, which can each form a vertical or horizontal space for a cable channel, for example, the base plates can advantageously possess terminals or other elements for electrical connection, by means of which the base plates can be connected with one another, wherein the said electrical connectors can, in particular, comprise signal connectors and/or current-conducting connectors. It is advantageous if the said electrical connection sections of the base plate are formed by means of three-dimensional printing technology, wherein it would also be possible, however, to subsequently affix the said electrical connectors to the plates formed by means of 3D printing in some other manner. The said electrical connection sections on the base plates are configured to match one another or to be complementary to one another, for example in the form of male and female connectors, so that the base plates can be joined together at the electrical connection sections during switchgear cabinet assembly.

Electrical connections such as plug-in connections or terminal connections, for example, can advantageously be provided also between the base plate and the switching elements to be arranged on it, in particular in such a manner that matching connectors, for example plug-in connections are formed on the base plate and at least one electrical switching element, and the at least one electrical switching element can be connected with the base plate by means of simply making the connection with the electrical connector.

The said electrical connectors on the base plate and/or on the electrical switching element can advantageously also be formed by means of the 3D printer, in particular during the same work step, in which the further corpus of the base plate and/or of the switching element is also formed. Fundamentally, however, it would also be possible to manufacture the electrical connector on the switching element in conventional manner and to connect it with the electrical connector on the base plate manufactured by means of 3D printing, or, vice versa, to provide the electrical connectors on the base plate by means of other manufacturing techniques and to connect an electrical connector on the switching element, manufactured by means of 3D printing, with them.

In advantageous manner, not only the base plate but rather also at least one of the switching elements, preferably also several or all of the switching elements, which are arranged on the base plate, can be manufactured by means of the 3D printer, using a three-dimensional printing method, wherein in particular, even a power-transmitting switching element can be manufactured using 3D printing, at least in part. Depending on the switching element, such manufacturing of the switching element by means of 3D printing can also relate to only part of the switching element, or, if applicable, the entire switching element can be manufactured in this manner.

It is advantageous if the switching element is configured as a composite material body composed of multiple materials, by means of 3D printing, wherein here, at least one signal-conducting and/or heat-conducting and/or current-conducting material in targeted structures can be embedded in a non-conductive matrix material. For example, a fuse can be produced as a 3D printed component, in which a current conductor is embedded in a non-conductive matrix material and built up layer by layer. Alternatively or in addition, a piezo switch, for example, can also be produced using the 3D printing method, in which a piezo element that deforms under the impact of current is built up in corresponding manner, layer by layer.

In a further development of the invention, the base plate and the at least one switching element can each be manufactured as separate components, by means of 3D printing, which components are subsequently assembled to one another, in particular by means of the aforementioned electrical connection sections.

In an alternative further development, however, it can also be provided that the base plate and at least one of the switching elements are built up integrally, in one piece, layer by layer, using a 3D printing technology process, so that the switching element affixed to the base plate grows out of the base plate, so to speak, layer by layer, and/or the base plate grows onto the switching element, layer by layer.

Use of 3D printing technology makes it possible to introduce conductive structures into the base plate and/or the respective switching element, the expanse of which structures deviates from the layered structure of the matrix corpus in which they are embedded. In particular, conductors that run at a slant relative to the layer planes can be introduced, which can extend in the manner of an electrical conductor or cable, in snake-like form, up and down or also only rising at a slant, through multiple matrix material layers. In contrast to the case of lamination techniques, signal-conducting and/or heat-conducting and/or current-conducting structures can be introduced, which can curve in all three dimensions and/or change in terms of their expanse.

BRIEF DESCRIPTION OF THE DRAWINGS

The invention will be explained in greater detail below, using an exemplary embodiment and a related drawing, which shows.

DETAILED DESCRIPTION

Figure 1:
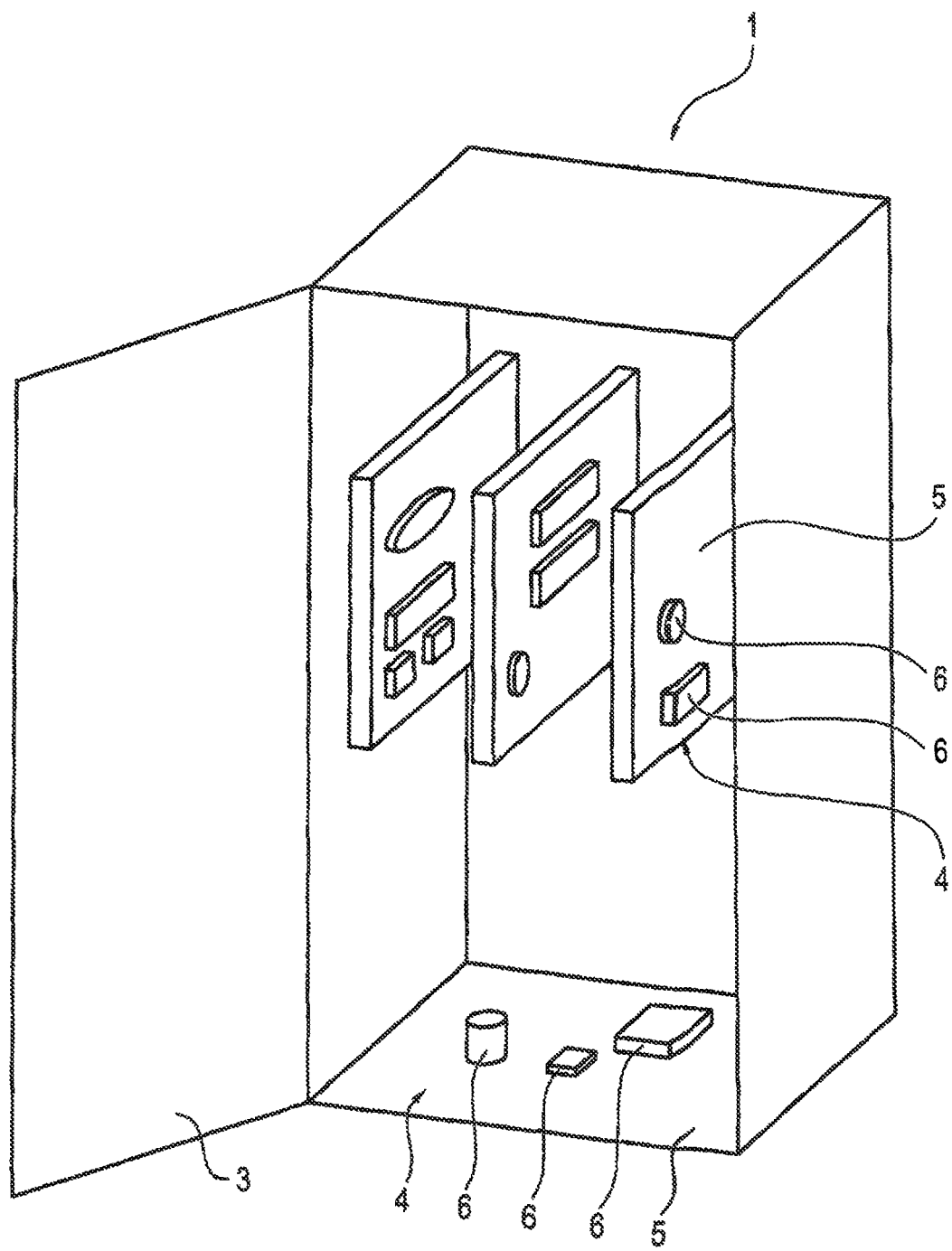
FIG. 1: a schematic, perspective representation of a switchgear cabinet with switchboards accommodated in it, which each comprise multiple electrical switching elements arranged on a base plate.

As FIG. 1 shows, the switchgear cabinet 1 can comprise a housing 2, formed in block shape, for example, if applicable having a door 3, in which housing multiple switchboards 4 can be accommodated, wherein the said switchboards 4 can be arranged horizontally or vertically in the interior of the housing 2.

The said switchboards 4 each comprise a base plate 5, on which multiple switching elements 6 are arranged, wherein the said switching elements 6 can be configured in the manner mentioned initially and can fulfill different functions of switching technology and/or power electronics. In particular, the said switching elements 6 together can form a switching device combination of a main circuit, which receives electrical power from a supplier such as a generator or a network, for example, and transmits and/or distributes it to one or more consumers, for example in the form of a motor. The said switching element 6 can therefore also be, in particular, power-transmitting components. In addition, part of the switching elements 6 can also form a switching device combination in an auxiliary circuit, which is provided for control, measurement, reporting, regulation and/or data processing.

Figure 2:
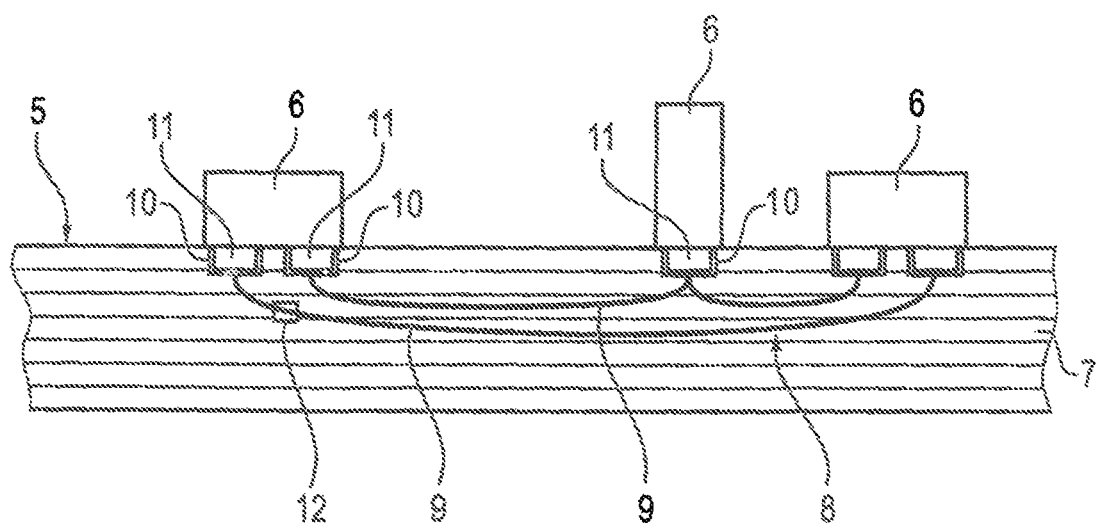
FIG. 2: a sectional view through a base plate having three switching elements, which view shows the connection conductors between the switching elements accommodated in the interior of the base plate.

As is illustrated in FIG. 2, the base plates 5 can be structured in a layered construction, specifically by means of a 3D printer, using 3D printing technology, wherein here, one or more materials can be applied, layer by layer, for example in powder form and/or paste form and/or liquid form, and can be liquefied and/or solidified and/or sintered and/or chemically converted and/or hardened in some other manner, by means of an energy beam such as a laser beam, for example. As FIG. 2 shows, in this regard a switching logic 8 comprising electrical connection conductors 9 can be integrated or embedded into the non-conductive matrix material layers 7, wherein the said switching logic 8 or its connection conductors 9 and, if applicable, further switching logic elements 12 such as shunts and the like can be built up from a signal-conducting and/or electrically conductive material such as copper, for example, during the course of the 3D printing process, and introduced, for example in that a copper powder track is laid at the desired locations of the electrically conductive structure, and then melted during the energy impact of the laser beam. Therefore the switching logic 8 or its connection conductors 9 can also be built up layer by layer.

In this regard, in advantageous manner, electrical connectors 10 are formed in the base plate 5, also by means of 3D printing technology, on a surface of the base plate 5, and configured to be connected with the connection conductors 9, wherein the said electrical connectors 10 can consist, for example, of sockets and/or plug projections and/or terminals.

The switching elements 6 to be affixed to the base plate 5 can be of a conventional nature, but it is advantageous if they are also manufactured, at least in part, by means of 3D printing technology, wherein electrical connectors 11 can also be formed on the switching elements 6 by means of 3D printing technology. In this regard, the electrical connectors 10 of the base plate 5 and the electrical connectors 11 of the switching elements 6 are configured to match one another, so that they can be directly connected with one another in order to produce the connection. In this regard, it is advantageous that plug-in connectors or terminal connectors having different contours and/or dimensions and/or special configurations in terms of their hole pattern can be provided, so that a specific switching element 6 can be plugged into the base plate only at a specific location or connected with a specific electrical connector 10 of the base plate, so that the correct connection and switching logic occur automatically. If terminals that are subsequently connected with lines are affixed on both base plates, it is advantageous if the respective terminals lie in such a manner that they can be connected by way of lines conducted in parallel, in order to minimize possible errors in wiring.

As an alternative to the said electrical connectors, however, it would also be possible to manufacture at least one of the switching elements 6 integrally in one piece with the base plate 5 during the course of 3D printing manufacturing.

In this regard, electrical connectors can be provided not just between the switching elements 6 and the respective base plate 5, but rather, alternatively or in addition to this, corresponding electrical connectors can be provided between multiple base plates 5, so that a switchboard 4 can be put together from multiple base plates. In this regard, it is also possible to combine base plates 5 to be installed horizontally with base plates 5 to be installed vertically.

I claim:

1. A method for making a switchgear cabinet comprising at least one switchboard having a base plate, on which electrical switching elements for transmitting and/or distributing electrical energy to at least one piece of equipment are arranged and electrically interconnected,
    wherein the switchgear cabinet comprises a main circuit that comprises a switching device combination and receives electrical power from at least one supplier and for transmitting and/or distributing the electrical power to one or more pieces of equipment, wherein the main circuit has power-transmitting switching elements,
    wherein the switchgear cabinet comprises an auxiliary circuit, wherein the auxiliary circuit comprises a switching device combination comprising switching logic for control of the main circuit,
    the method for making the switchgear cabinet comprising:
    3D printing with a 3D printing method by a 3D printer the base plate, at least one switching element of the auxiliary circuit, and at least one power-transmitting switching element of the main circuit,
    wherein the 3D printing method comprises forming the base plate as a composite material plate composed of different materials, and embedding a current-conducting material in the form of targeted structures in a non-conductive matrix material, wherein the switching logic is integrated into the base plate, wherein the 3D printing method comprises forming the switching logic by the 3D printer while the base plate is being formed,
    wherein the 3D printing method comprises forming at least one electrical connector on the at least one base plate by the 3D printer and forming at least one electrical connector on the at least one power-transmitting switching element of the main circuit by the 3D printer, and
    connecting the at least one power-transmitting switching element of the main circuit with the base plate by joining the electrical connectors together.

2. The method of claim 1, wherein the one or more pieces of equipment comprise a motor.

3. The method of claim 1, wherein the auxiliary circuit is provided for control, measurement, reporting, regulation and/or data processing.

4. The method of claim 1, wherein electrical connection conductors connect the electrical switching elements and is/are integrated into the base plate;
    Wherein the 3D printing method comprises forming the electrical connection conductors by the 3D printer while the base plate is being formed.

5. The method of claim 1, wherein the switchgear cabinet contains multiple base plates that are connected with one another, and the method further comprises forming by 3D printing electrical connections that match one another on the base plates, and assembly of the switchgear cabinet, wherein the assembly comprises joining the multiple base plates together.

6. The method of claim 1, further comprising forming the base plate together with at least one switching element arranged on it, integrally in one piece, by the 3D printer.

7. The method of claim 1, further comprising forming at least one of the switching elements as a composite material body, from different materials, by 3D printing, and embedding at least one signal-conducting and/or heat-conducting and/or current-conducting material in targeted structures into a non-conductive matrix material.

8. The method of claim 1, further comprising manufacturing at least one power-electronics component by the 3D printer using the 3D printing method,
    wherein the at least one power-electronics component comprises a power converter and/or a frequency inverter.

9. The method of claim 1, further comprising manufacturing at least one fuse to be connected with the base plate by the 3D printer using the 3D printing method.

10. The method of claim 1, further comprising manufacturing at least part of the housing of the switchgear cabinet is by the 3D printer using 3D printing technology, wherein the at least part of the housing has at least one holder and/or guide for holding and/or guiding the at least one base plate by 3D printing.

11. The method of claim 1, further comprising building up, layer by layer, in a layered construction method, the at least one base plate and/or at least one of the switching elements, wherein the material layers are liquefied and/or solidified by a laser beam and/or electron beam and/or plasma beam.

12. The method of claim 1, wherein the supplier comprises a generator or a network.

13. A method for making a switchgear cabinet comprising at least one switchboard having at least one base plate, on which electrical switching elements for transmitting and/or distributing electrical energy to at least one piece of equipment are arranged and electrically interconnected, comprising:
    3D printing with a 3D printing method by a 3D printer at least one of the at least base plate, at least one switching element of an auxiliary circuit, and at least one power transmitting element of a main circuit; and
    forming at least one of the at least one base plate as a composite material plate composed of different materials and embedding a current-conducting material in a non-conductive material,
    forming at least one electrical connector on the at least one base plate by the 3D printer and forming at least one electrical connector on the at least one power transmitting element by the 3D printer, and connecting at least one power transmitting element with the at least one base plate, wherein the connecting comprises joining the electrical connectors together, and wherein the 3D printing method comprises forming at least one of the at least one switching element of the auxiliary circuit by the 3D printer while the base plate is being formed, and wherein the at least one of the at least one switching element of the auxiliary circuit formed while the base plate is being formed is integrated with the base plate.

* * * * *